United States Patent
Lee et al.

(10) Patent No.: US 11,903,313 B2
(45) Date of Patent: Feb. 13, 2024

(54) THERMOELECTRIC ELEMENT

(71) Applicant: LG INNOTEK CO., LTD., Seoul (KR)

(72) Inventors: Se Woon Lee, Seoul (KR); Young Sam Yoo, Seoul (KR); Seung Hwan Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/252,062

(22) PCT Filed: Jun. 5, 2019

(86) PCT No.: PCT/KR2019/006826
§ 371 (c)(1),
(2) Date: Dec. 14, 2020

(87) PCT Pub. No.: WO2020/004827
PCT Pub. Date: Jan. 2, 2020

(65) Prior Publication Data
US 2021/0249578 A1  Aug. 12, 2021

(30) Foreign Application Priority Data

Jun. 26, 2018 (KR) .......... 10-2018-0073413

(51) Int. Cl.
*H10N 10/17* (2023.01)
*H10N 10/13* (2023.01)

(52) U.S. Cl.
CPC ............. *H10N 10/17* (2023.02); *H10N 10/13* (2023.02)

(58) Field of Classification Search
CPC ......... H01L 35/30; H01L 35/32; H10N 10/13; H10N 10/17
See application file for complete search history.

(56) References Cited

U.S. PATENT DOCUMENTS

| 2006/0191271 A1* | 8/2006 | Takahashi | H01L 35/08 136/204 |
| 2007/0028955 A1* | 2/2007 | Sogou | H01L 35/32 136/200 |

(Continued)

FOREIGN PATENT DOCUMENTS

| JP | 2016-225346 | 12/2016 |
| KR | 10-1460432 | 11/2014 |

(Continued)

OTHER PUBLICATIONS

International Search Report dated Sep. 11, 2019 issued in Application No. PCT/KR2019/006826.

(Continued)

*Primary Examiner* — Tamir Ayad
(74) *Attorney, Agent, or Firm* — KED & ASSOCIATES, LLP

(57) ABSTRACT

A thermoelectric element according to one embodiment of the present invention comprises: a first metal substrate; a first resin layer which is arranged on the first metal substrate and which comes into direct contact with the first metal substrate; a plurality of first electrodes arranged on the first resin layer; a plurality of P-type thermoelectric legs and a plurality of N-type thermoelectric legs which are arranged on the plurality of first electrodes; a plurality of second electrodes arranged on the plurality of P-type thermoelectric legs and the plurality of N-type thermoelectric legs; a second resin layer arranged on the plurality of second electrodes; and a second metal substrate which is arranged on the second resin layer and which comes into direct contact with the second resin layer, wherein the adhesion strength between the first resin layer and the plurality of first electrodes differs from the adhesion strength between the second resin layer and the plurality of second electrodes.

13 Claims, 11 Drawing Sheets

(56) References Cited

U.S. PATENT DOCUMENTS

| | | | |
|---|---|---|---|
| 2010/0108117 A1 | 5/2010 | Hamano et al. | |
| 2010/0170550 A1* | 7/2010 | Hiroyama | H01L 35/08 |
| | | | 136/205 |
| 2010/0186424 A1 | 7/2010 | Horio | |
| 2011/0220164 A1* | 9/2011 | Guha | H01L 35/34 |
| | | | 438/54 |
| 2013/0014516 A1 | 1/2013 | Yang et al. | |
| 2013/0081663 A1 | 4/2013 | Yang et al. | |
| 2014/0102499 A1* | 4/2014 | Takahashi | H01L 35/32 |
| | | | 136/201 |
| 2014/0209139 A1* | 7/2014 | Angermann | C22C 1/002 |
| | | | 136/200 |
| 2016/0104829 A1* | 4/2016 | Hayashi | H01L 35/32 |
| | | | 136/203 |

FOREIGN PATENT DOCUMENTS

| | | |
|---|---|---|
| KR | 10-2016-0056370 | 5/2016 |
| KR | 10-2017-0064336 | 6/2017 |
| KR | 10-2017-0076358 | 7/2017 |

OTHER PUBLICATIONS

European Search Report dated Feb. 7, 2022 issued in EP Application No. 19826401.2.
Chinese Office Action dated Aug. 5, 2023 issued in Application No. 201980043320.6.

* cited by examiner

[FIG. 1]
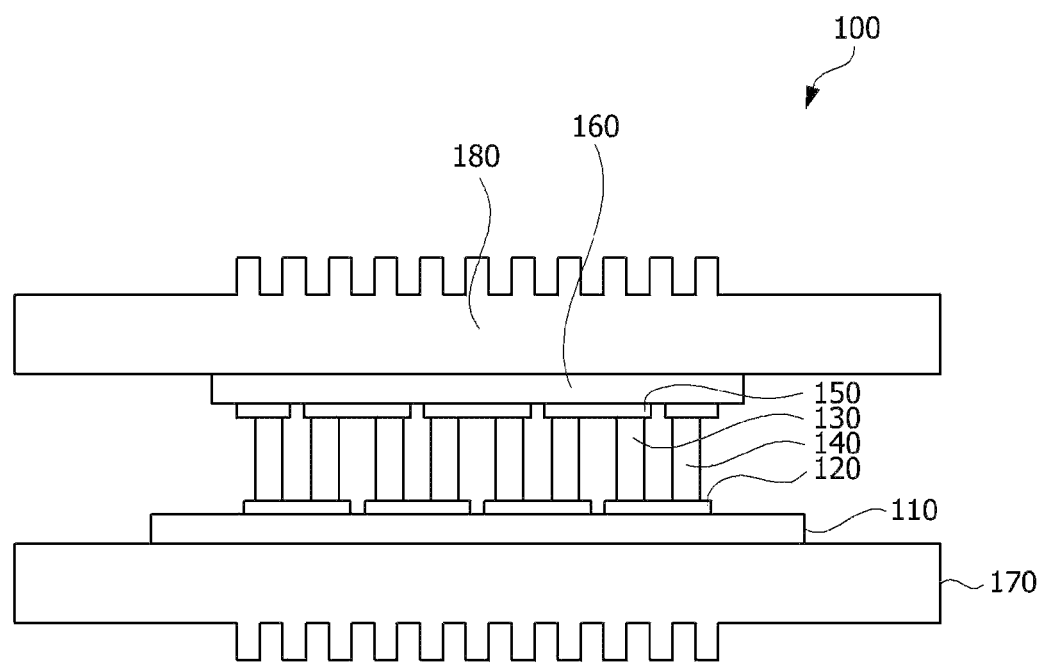

[FIG. 2]
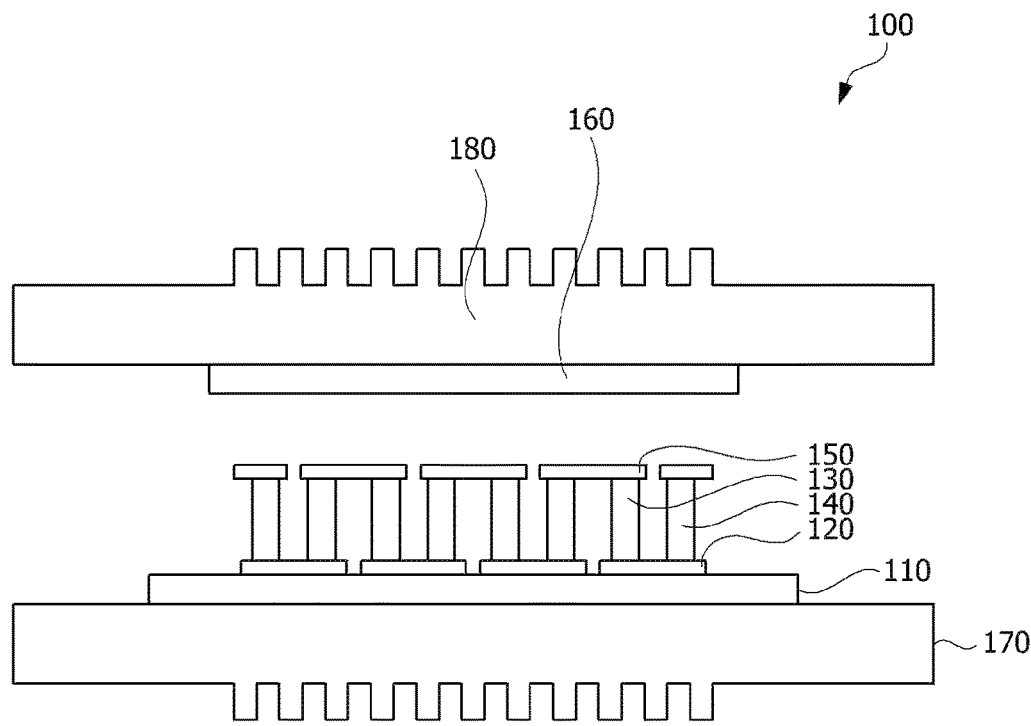
[FIG. 3]
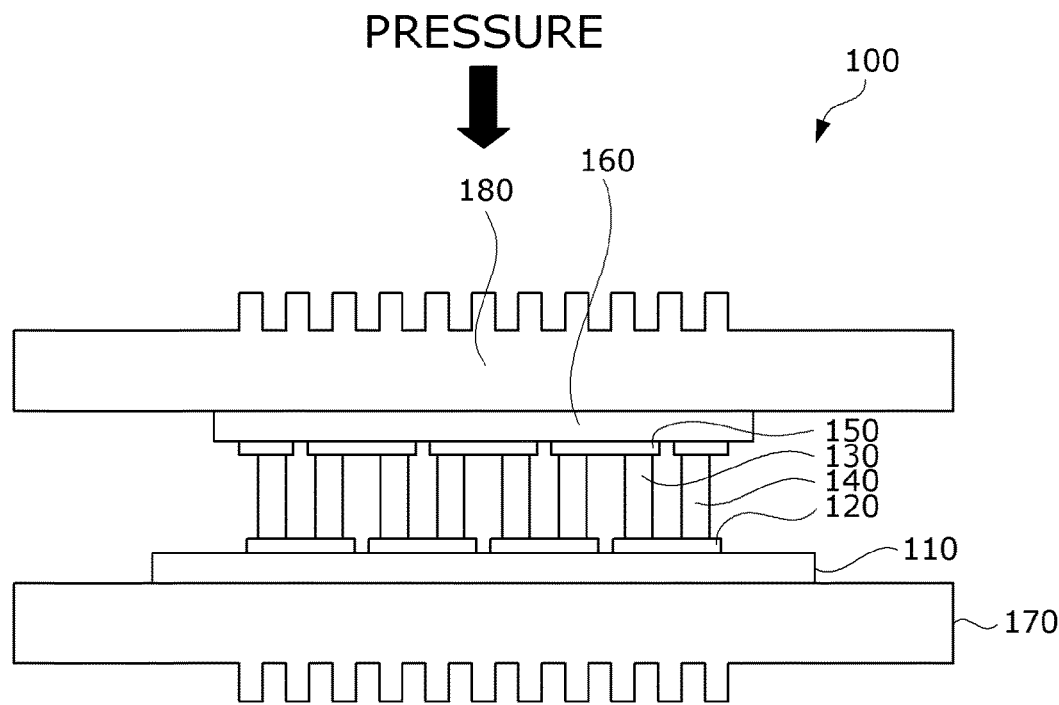

[FIG. 4A]
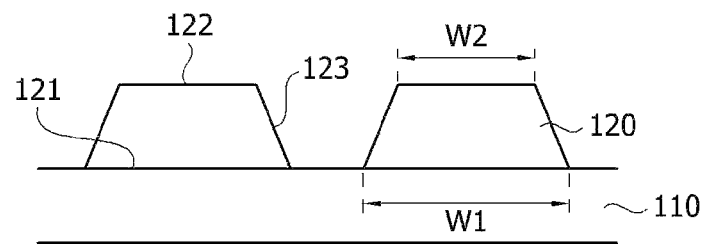
[FIG. 4B]
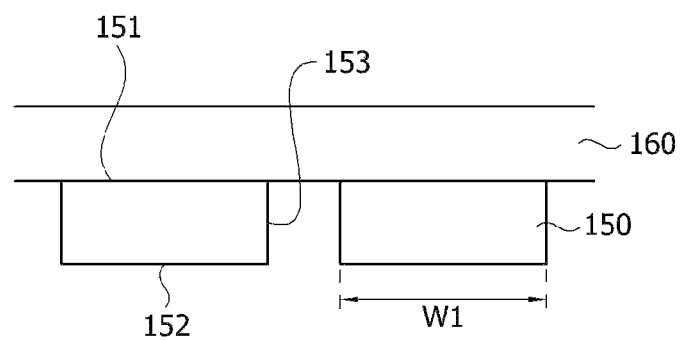

[FIG. 5A]
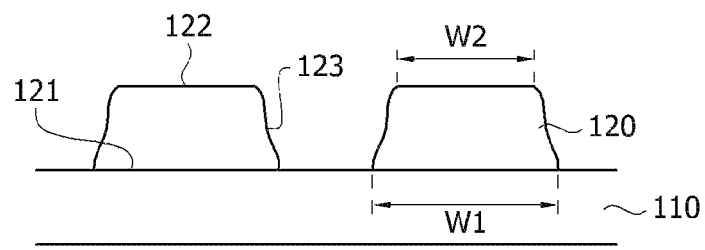
[FIG. 5B]
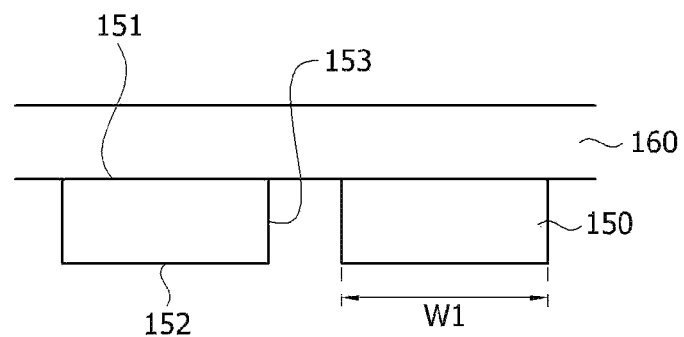

[FIG. 6]
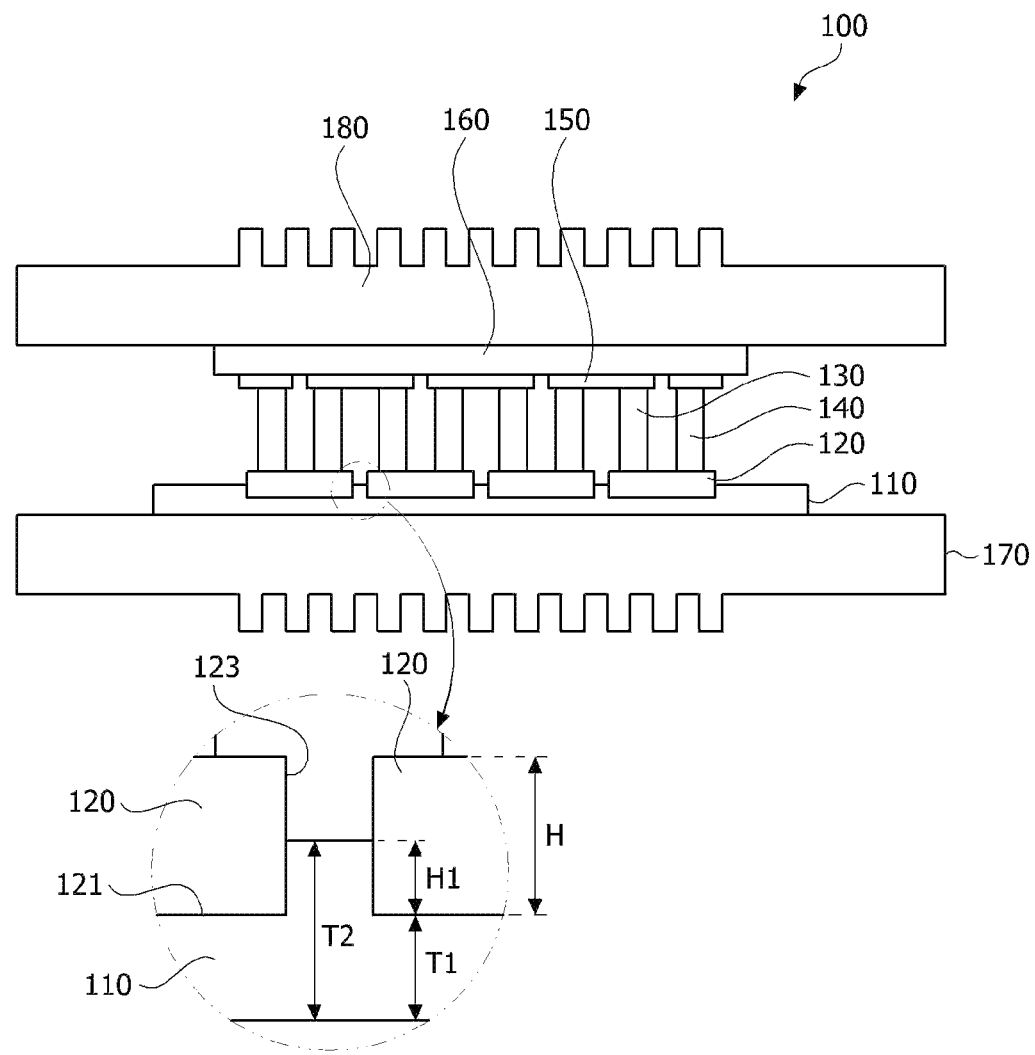

[FIG. 7]
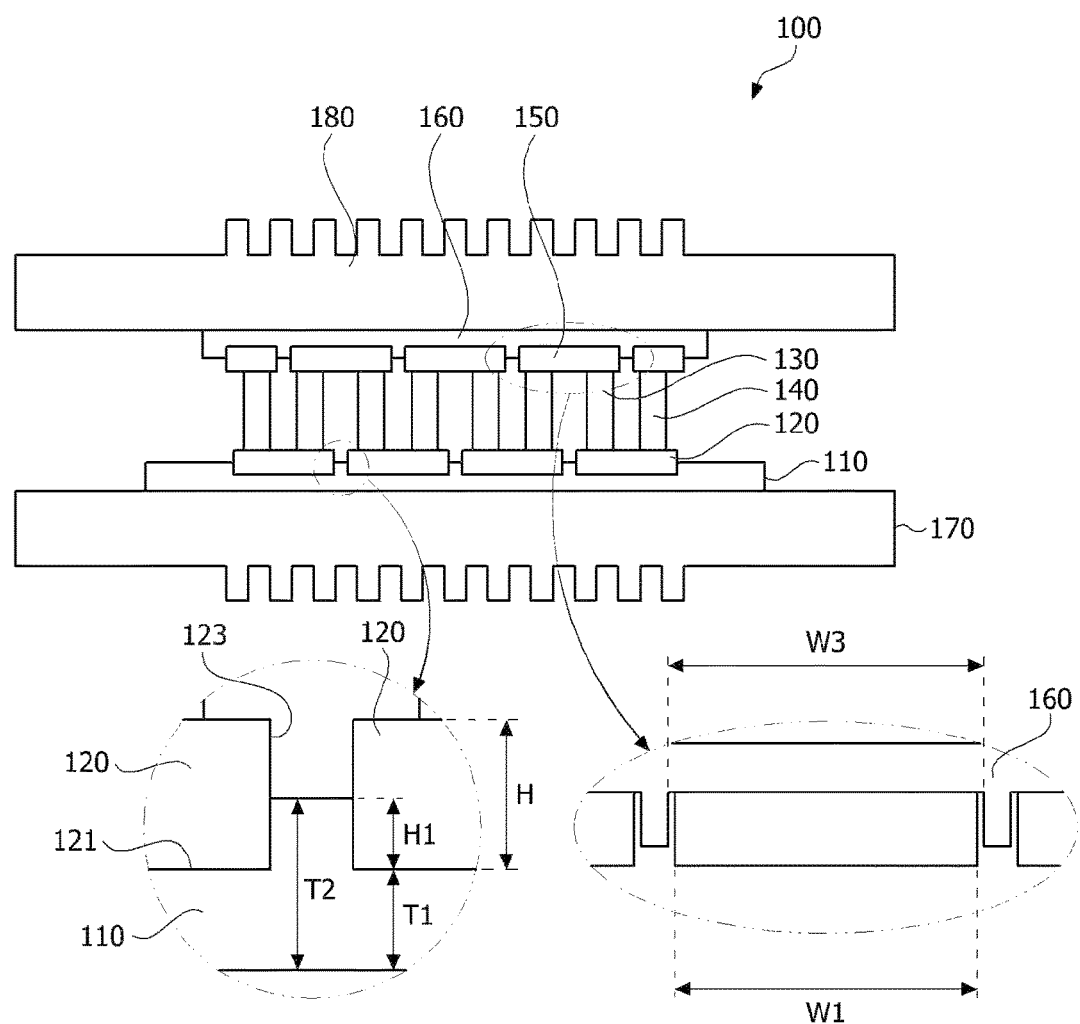

[FIG. 8]
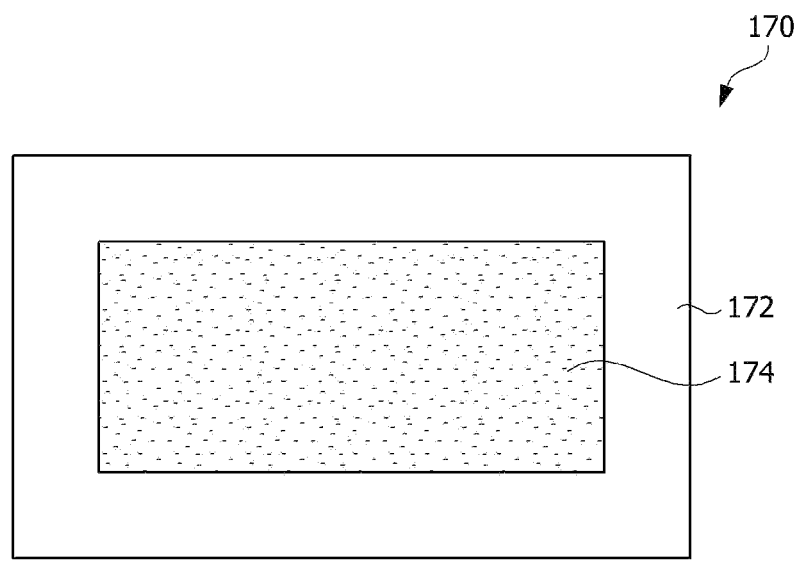
[FIG. 9]
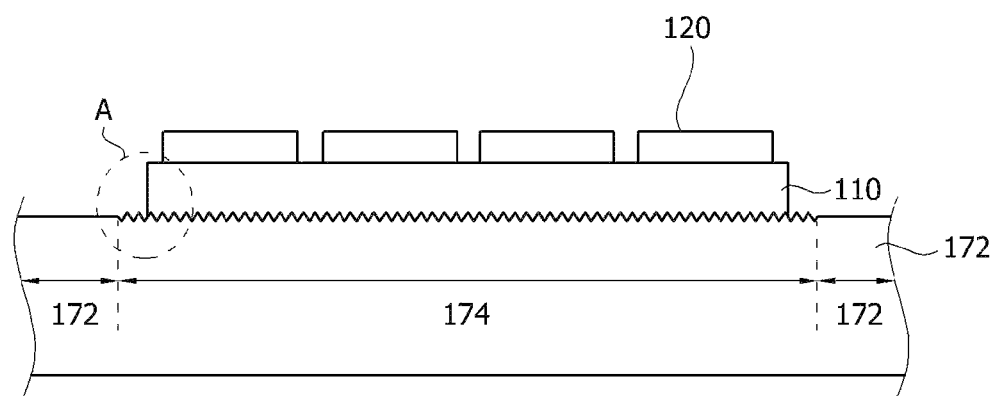

[FIG. 10]
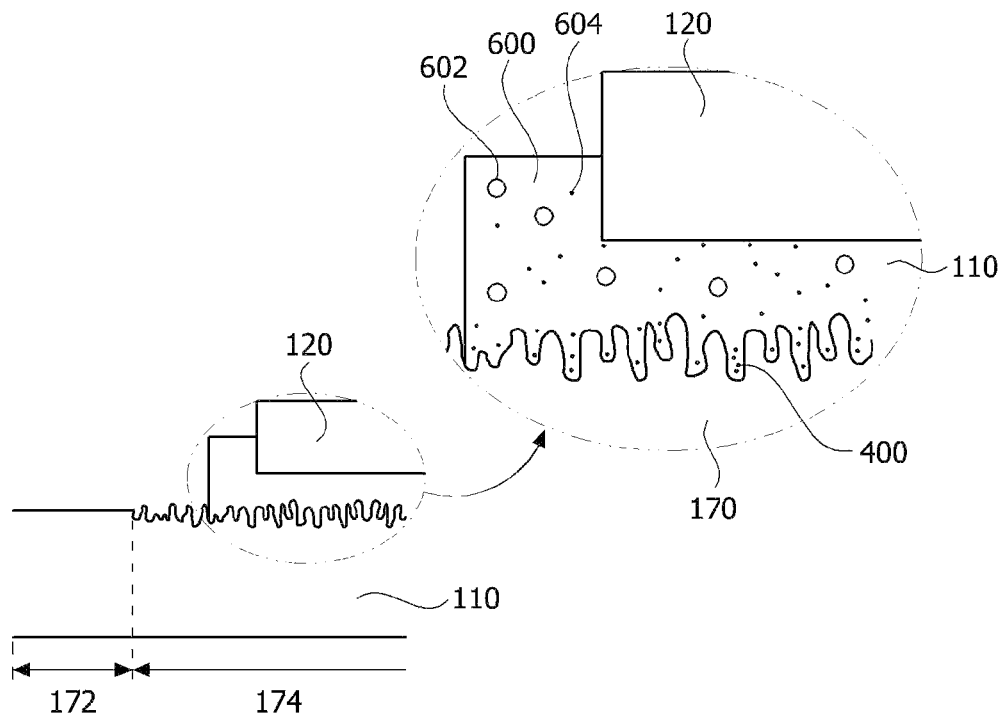
[FIG. 11]
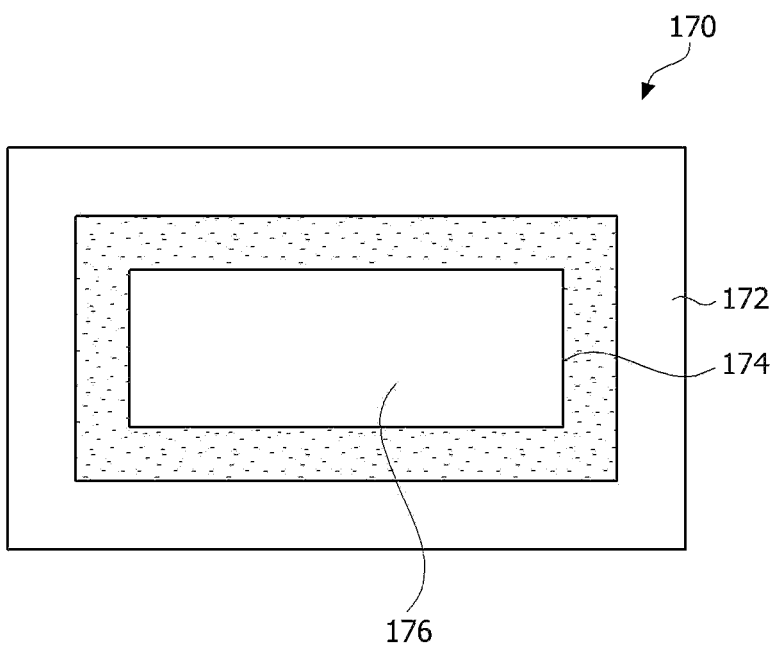

[FIG. 12]
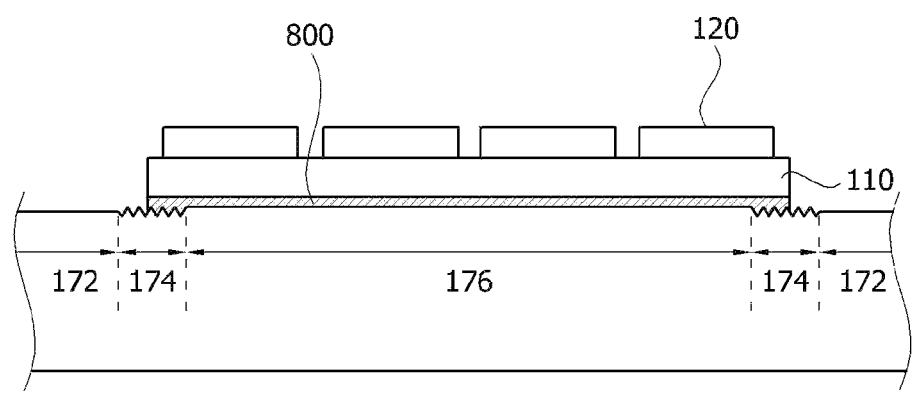

[FIG. 13A]
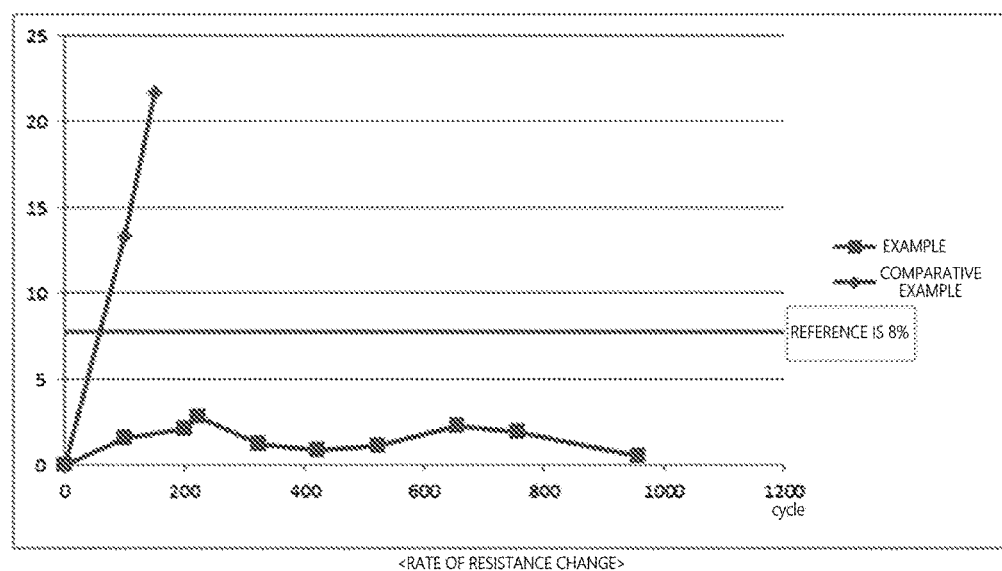
<RATE OF RESISTANCE CHANGE>
[FIG. 13B]
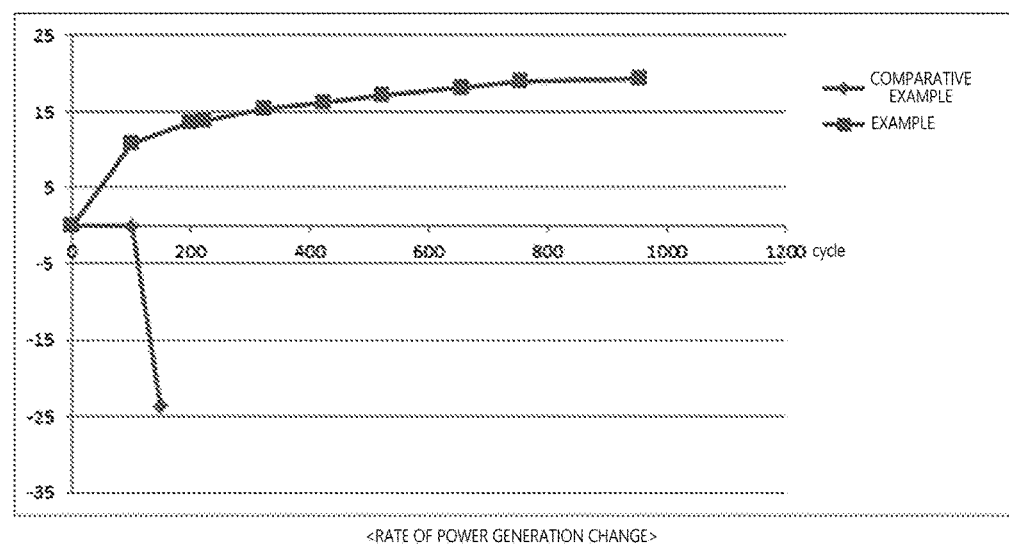
<RATE OF POWER GENERATION CHANGE>

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2019/006826, filed Jun. 5, 2019, which claims priority to Korean Patent Application No. 10-2018-0073413, filed Jun. 26, 2018, whose entire disclosures are hereby incorporated by reference.

TECHNICAL FIELD

The present invention relates to a thermoelectric element, and more specifically, to an assembly structure of the thermoelectric element.

BACKGROUND ART

A thermoelectric phenomenon is a phenomenon which occurs by movement of electrons and holes in a material, and refers to direct energy conversion between heat and electricity.

A thermoelectric element is a generic term for a device using the thermoelectric phenomenon, and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like. The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element increases more and more.

The thermoelectric element includes substrates, electrodes, and thermoelectric legs, a plurality of thermoelectric legs are arranged in an array shape between an upper substrate and a lower substrate, a plurality of upper electrodes are arranged between the plurality of thermoelectric legs and the upper substrate, and a plurality of lower electrodes are arranged between the plurality of thermoelectric legs and the lower substrate. In this case, one of the upper substrate and the lower substrate can be a low-temperature part, and the other can be a high-temperature part. When the thermoelectric element is applied to an apparatus for power generation, power generation performance increases as a temperature difference between the low-temperature part and the high-temperature part increases. Accordingly, the temperature of the high-temperature part can rise to 200° C. or higher. When the temperature of the high-temperature part is 200° C. or higher, an electrode structure can be destroyed due to a difference in a thermal expansion coefficient between the substrate on the high-temperature part side and the electrode. Accordingly, a crack can be applied to a bonding surface between a solder arranged on the electrode and the thermoelectric leg, and can lower the reliability of the thermoelectric element.

DISCLOSURE

Technical Problem

The present invention is directed to providing an assembly structure of a thermoelectric element.

Technical Solution

One aspect of the present invention provides a thermoelectric element including: a first metal substrate; a first resin layer which is arranged on the first metal substrate, and comes into direct contact with the first metal substrate; a plurality of first electrodes arranged on the first resin layer; a plurality of P-type thermoelectric legs and a plurality of N-type thermoelectric legs which are arranged on the plurality of first electrodes; a plurality of second electrodes arranged on the plurality of P-type thermoelectric legs and the plurality of N-type thermoelectric legs; a second resin layer arranged on the plurality of second electrodes; and a second metal substrate which is arranged on the second resin layer, and comes into direct contact with the second resin layer, wherein the bonding strength between the first resin layer and the plurality of first electrodes is different from the bonding strength between the second resin layer and the plurality of second electrodes.

The first metal substrate and the first resin layer may be a low-temperature part, the second metal substrate and the second resin layer may be a high-temperature part, and the bonding strength between the first resin layer and the plurality of first electrodes may be higher than the bonding strength between the second resin layer and the plurality of second electrodes.

The bonding strength between the first resin layer and the plurality of first electrodes may be five times or more the bonding strength between the second resin layer and the plurality of second electrodes.

The bonding strength between the second resin layer and the plurality of second electrodes may be 3 kgf/7.8625 mm2 or less.

The bonding strength between the first resin layer and the plurality of first electrodes may be 20 kgf/7.8625 mm2 or more.

The first resin layer and the plurality of first electrodes may adhere to each other, and the second resin layer and the plurality of second electrodes may come into contact with each other.

The first metal substrate and the second metal substrate may be fixed to each other.

The first metal substrate and the second metal substrate may be fixed to each other by a screw.

A plurality of grooves may be formed in the second resin layer, and a surface among both surfaces of each of the plurality of second electrodes which comes into contact with the second resin layer and parts of side surfaces of the plurality of second electrodes may be accommodated in the plurality of grooves.

A width of each of the plurality of grooves may be greater than a width of the surface among both surfaces of each of the plurality of second electrodes which comes into contact with the second resin layer.

Parts of side surfaces of the plurality of first electrodes may be buried in the first resin layer.

Parts of side surfaces of the plurality of second electrodes may be buried in the second resin layer, and a height of each of the side surfaces of the plurality of second electrodes buried in the second resin layer may be smaller than a height of each of the side surfaces of the plurality of first electrodes buried in the first resin layer.

Advantageous Effects

According to an embodiment of the present invention, a thermoelectric element having excellent thermal conductivity, low heat loss, and high reliability can be obtained. Specifically, the thermoelectric device according to the embodiment of the present invention can maintain stable reliability even at high temperatures.

DESCRIPTION OF DRAWINGS

FIG. 1 is a cross-sectional view of a thermoelectric element according to one embodiment of the present invention.

FIGS. 2 and 3 are views for describing a process of manufacturing the thermoelectric element according to one embodiment of the present invention.

FIGS. 4A and 4B illustrate a cross section of an electrode of the thermoelectric element according to one embodiment of the present invention.

FIGS. 5A and 5B illustrate a cross section of an electrode of a thermoelectric element according to another embodiment of the present invention.

FIGS. 6 and 7 are cross-sectional views of a thermoelectric element according to still another embodiment of the present invention.

FIG. 8 is a top view of a first metal substrate of the thermoelectric element according to one embodiment of the present invention.

FIG. 9 is a cross-sectional view of the first metal substrate of the thermoelectric element according to the embodiment in FIG. 8.

FIG. 10 is an enlarged cross-sectional view of the first metal substrate of the thermoelectric element according to the embodiment in FIG. 8.

FIG. 11 is a top view of a first metal substrate of the thermoelectric element according to another embodiment of the present invention.

FIG. 12 cross-sectional view of the first metal substrate of the thermoelectric element according to the embodiment in FIG. 11.

FIGS. 13A and 13B are graphs comparing a rate of a change in resistance and a rate of a change in power generation of thermoelectric devices according to Comparative Example and Example.

MODES OF THE INVENTION

Figure 14:
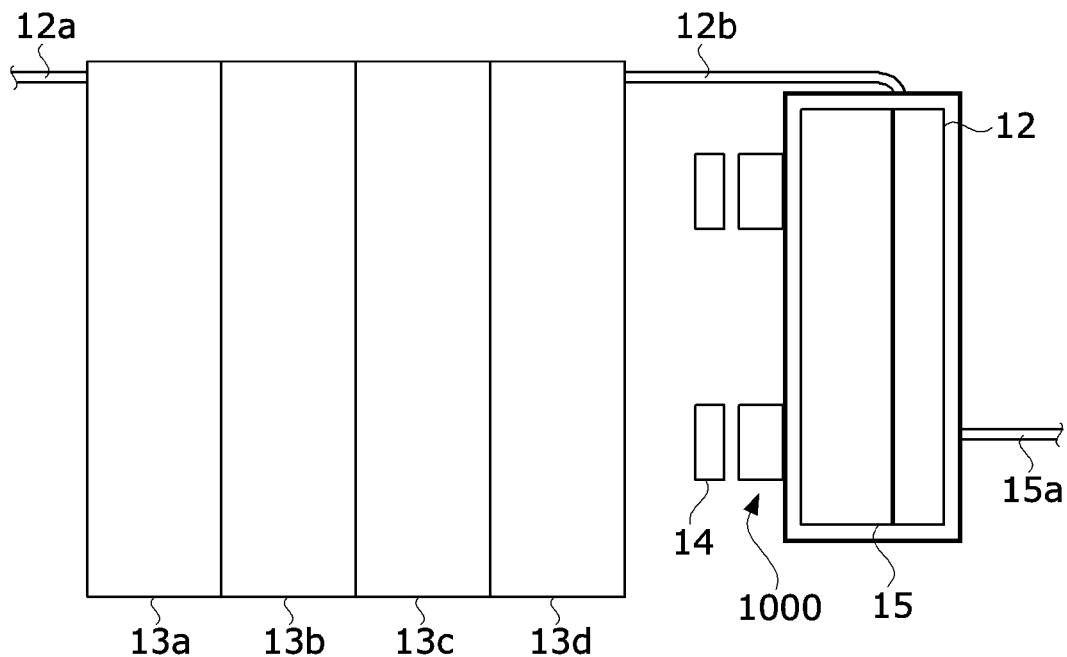
FIG. 14 is a block diagram of a water purifier to which the thermoelectric element according to the embodiment of the present invention is applied.

Since the present invention may be variously changed and have various embodiments, particular embodiments will be exemplified and described in the drawings. However, it should be understood that the present invention is not limited to the particular embodiments and includes all changes, equivalents, and substitutes within the spirit and the scope of the present invention.

Further, although the terms "second," "first," and the like may be used herein to describe various elements, the elements are not limited by the terms. The terms are only used to distinguish one element from another. For example, a first element may be termed a second element, and similarly, a second element may be termed a first element without departing from the scope of the present invention. The term "and/or" includes any one or any combination among a plurality of associated listed items.

When predetermined components are mentioned as being "linked," or "connected" to other components, the components may be directly linked or connected to other components, but it should be understood that additional components may be present therebetween. On the other hand, when the predetermined components are mentioned as being "directly linked," or "directly connected" to other components, it should be understood that no additional components are not present between the above-described components.

Terms used in the present application are used solely to describe the particular embodiments and not to limit the present invention. The singular form is intended to also include the plural form, unless the context clearly indicates otherwise. It should be further understood that the terms "include," "including," "provide," "providing," "have," and/or "having" specify the presence of stated features, integers, steps, operations, elements, components, and/or groups thereof but do not preclude the presence or addition of one or more other features, integers, steps, operations, elements, components, and/or groups thereof.

Unless otherwise defined, all terms including technical or scientific terms used in the present application have meanings which are the same as those of terms generally understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments will be described in detail with reference to the accompanying drawing drawings, the same reference numerals are applied to the same or corresponding elements, and redundant description thereof will be omitted.

FIG. 1 is a cross-sectional view of a thermoelectric element according to one embodiment of the present invention, and FIGS. 2 and 3 are views for describing a process of manufacturing the thermoelectric element according to one embodiment of the present invention.

Referring to FIG. 1, a thermoelectric element 100 includes a first resin layer 110, a plurality of first electrodes 120, a plurality of P-type thermoelectric legs 130, a plurality of N-type thermoelectric legs 140, a plurality of second electrodes 150, and a second resin layer 160.

The plurality of first electrodes 120 are arranged between the first resin layer 110 and lower surfaces of the plurality of P-type thermoelectric legs 130 and the plurality of N-type thermoelectric legs 140, and the plurality of second electrodes 150 are arranged between the second resin layer 160 and upper surfaces of the plurality of P-type thermoelectric legs 130 and the plurality of N-type thermoelectric legs 140. Accordingly, the plurality of P-type thermoelectric legs 130 and the plurality of N-type thermoelectric legs 140 are electrically connected by the plurality of first electrodes 120 and the plurality of second electrodes 150. One pair of the P-type thermoelectric leg 130 and the N-type thermoelectric leg 140 which are arranged between the first electrode 120 and the second electrode 150 and electrically connected to each other may form a unit cell. When a voltage is applied to the first electrode 120 and the second electrode 150 through a lead line, a substrate through which current flows from the P-type thermoelectric legs 130 to the N-type thermoelectric legs 140 due to the Peltier effect may absorb heat to function as a cooling part, and a substrate through which current flows from the N-type thermoelectric legs 140 to the P-type thermoelectric legs 130 may be heated to function as a heating part. Alternatively, when a temperature difference between the first electrode 120 and the second electrode 150 is applied, charges in the P-type thermoelectric legs 130 and the N-type thermoelectric legs 140 move due to the Seebeck effect, and thus electricity may be generated.

One pair of the P-type thermoelectric leg 130 and the N-type thermoelectric leg 140 may be arranged on each of the first electrodes 120, and one pair of the P-type thermoelectric leg 130 and the N-type thermoelectric leg 140 may be arranged on each of the second electrodes 150 to overlap one of one pair of the P-type thermoelectric leg 130 and the N-type thermoelectric leg 140 arranged on the first electrode 120.

Here, the P-type thermoelectric legs 130 and the N-type thermoelectric legs 140 may be bismuth telluride (Bi—Te)-based thermoelectric legs including bismuth (Bi) and tellurium (Te) as main raw materials. The P-type thermoelectric legs 130 may be thermoelectric legs including a bismuth telluride (Bi—Te)-based main raw material, in an amount of 99 to 99.999 wt %, including at least one among antimony (Sb), nickel (Ni), aluminum (Al), copper (Cu), silver (Ag), lead (Pb), boron (B), gallium (Ga), tellurium (Te), bismuth (Bi), and indium (In), and a 0.001 to 1 wt % mixture including Bi or Te based on the total weight of 100 wt %. For example, the main raw material may be Bi—Se—Te, and Bi or Te may be further included in an amount of 0.001 to 1 wt % of the total weight. The N-type thermoelectric legs 140 may be thermoelectric legs including a bismuth telluride (Bi—Te)-based main raw material, in an amount of 99 to 99.999 wt %, including at least one among selenium (Se), nickel (Ni), aluminum (Al), copper (Cu), silver (Ag), lead (Pb), boron (B), gallium (Ga), tellurium (Te), bismuth (Bi), and indium (In), and a 0.001 to 1 wt % mixture including Bi or Te based on the total weight of 100 wt %. For example, the main raw material may be Bi—Sb—Te, and Bi or Te may be further included in an amount of 0.001 to 1 wt % of the total weight.

The P-type thermoelectric legs 130 and the N-type thermoelectric legs 140 may be formed in a bulk type or a stacked type. Generally, the bulk type P-type thermoelectric legs 130 or the bulk type N-type thermoelectric legs 140 may be obtained through a process of producing an ingot by heat-treating a thermoelectric material, pulverizing and sieving the ingot to obtain powder for thermoelectric legs, sintering the powder, and cutting the sintered object. The stacked type P-type thermoelectric legs 130 or the stacked type N-type thermoelectric legs 140 may be obtained through a process of forming a unit member by applying a paste including a thermoelectric material onto a sheet-shaped base material, and then stacking and cutting the unit member.

In this case, one pair of the P-type thermoelectric leg 130 and the N-type thermoelectric leg 140 may have the same shape and volume, or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

The performance of the thermoelectric element according to one embodiment of the present invention may be expressed as a thermoelectric performance index. The thermoelectric performance index (ZT) may be expressed as in Equation 1.

$$ZT = \alpha^2 \cdot \sigma \cdot T/k$$ [Equation 1]

Here, α is the Seebeck coefficient [V/K], σ is electrical conductivity [S/m], and α2σ is a power factor (W/mK2]). Further, T is a temperature, and k is thermal conductivity [W/mK]. k may be expressed as a·cp·ρ, wherein a is thermal diffusivity [cm2/S], cp is specific heat [J/gK], and ρ is density [g/cm3].

In order to obtain the thermoelectric performance index of the thermoelectric element, a Z value (V/K) is measured using a Z meter, and the thermoelectric performance index (ZT) may be calculated using the measured Z value.

Here, the plurality of first electrodes 120 arranged between the first resin layer 110 and the P-type thermoelectric legs 130 and the N-type thermoelectric legs 140, and the plurality of second electrodes 150 arranged between the second resin layer 160 and the P-type thermoelectric legs 130 and the N-type thermoelectric legs 140 may each include at least one of copper (Cu), silver (Ag), and nickel (Ni).

Further, the first resin layer 110 and the second resin layer 160 may have different sizes. For example, a volume, a thickness, or an area of one of the first resin layer 110 and the second resin layer 160 may be formed larger than a volume, a thickness, or an area of the other one. Accordingly, it is possible to increase the heat absorption performance or the heat dissipation performance of the thermoelectric element.

In this case, the P-type thermoelectric leg 130 or the N-type thermoelectric leg 140 may have a cylindrical shape, a polygonal pillar shape, an elliptical pillar shape, and the like.

Alternatively, the P-type thermoelectric leg 130 or the N-type thermoelectric leg 140 may have a stacked structure. For example, the P-type thermoelectric legs or the N-type thermoelectric legs may be formed by a method of stacking a plurality of structures applied with a semiconductor material onto a sheet-shaped base material, and then cutting the structures. Accordingly, material loss may be prevented and an electrical conduction characteristic may be enhanced.

Alternatively, the P-type thermoelectric leg 130 or the N-type thermoelectric leg 140 may be manufactured according to a zone melting method or a powder sintering method. According to the zone melting method, the thermoelectric leg is obtained through a process of slowly applying heat to the ingot to refine particles so that the particles are rearranged in a single direction after manufacturing the ingot using the thermoelectric material, and slowly cooling. According to the powder sintering method, the thermoelectric leg is obtained through a process of pulverizing and sieving the ingot to obtain powder for thermoelectric legs and sintering the powder after manufacturing the ingot using the thermoelectric material.

According to the embodiment of the present invention, the first resin layer 110 may be arranged on a first metal substrate 170, and a second metal substrate 180 may be arranged on the second resin layer 160.

The first metal substrate 170 and the second metal substrate 180 may be formed of aluminum, an aluminum alloy, copper, a copper alloy, or the like. The first metal substrate 170 and the second metal substrate 180 may support the first resin layer 110, the plurality of first electrodes 120, the plurality of P-type thermoelectric legs 130, the plurality of N-type thermoelectric legs 140, the plurality of second electrodes 150, the second resin layer 160, and the like, and may be regions directly attached to an application to which the thermoelectric element 100 according to the embodiment of the present invention is applied. Accordingly, the first metal substrate 170 and the second metal substrate 180 may be interchanged with a first metal support and a second metal support, respectively.

An area of the first metal substrate 170 may be larger than an area of the first resin layer 110, and an area of the second metal substrate 180 may be larger than an area of the second resin layer 160. That is, the first resin layer 110 may be arranged in a region spaced apart from an edge of the first metal substrate 170 by a predetermined distance, and the second resin layer 160 may be arranged in a region spaced apart from an edge of the second metal substrate 180 by a predetermined distance.

The first resin layer 110 and the second resin layer 160 may be formed of an epoxy resin composition including an epoxy resin and an inorganic filler. Here, the inorganic filler may be included at 68 to 88 vol % of the epoxy resin composition. When the inorganic filler is included at less than 68 vol %, a heat conduction effect may be low, and when the inorganic filler is included at more than 88 vol %, adhesion between the resin layer and the metal substrate may be lowered, and the resin layer may be easily broken.

A thickness of each of the first resin layer 110 and the second resin layer 160 may be 0.02 to 0.6 mm, preferably, 0.1 to 0.6 mm, and more preferably, 0.2 to 0.6 mm, and thermal conductivity may be 1 W/mK or more, preferably, 10 W/mK or more, and more preferably, 20 W/mK or more.

The epoxy resin may include an epoxy compound and a curing agent. In this case, the curing agent may be included at a volume ratio of 1 to 10 with respect to a volume ratio of 10 of the epoxy compound. Here, the epoxy compound may include at least one of a crystalline epoxy compound, an amorphous epoxy compound, and a silicone epoxy compound. The crystalline epoxy compound may include a mesogen structure. A mesogen is a basic unit of a liquid crystal, and includes a rigid structure. Further, the amorphous epoxy compound may be a general amorphous epoxy compound having two or more epoxy groups in a molecule, and may be, for example, glycidyl ethers derived from bisphenol A or bisphenol F. Here, the curing agent may include at least one of an amine-based curing agent, a phenol-based curing agent, an acid anhydride-based curing agent, a polymercaptan-based curing agent, a polyamino-amide-based curing agent, an isocyanate-based curing agent, and a block isocyanate curing agent, and two or more types of curing agents may be mixed and used.

The inorganic filler may include aluminum oxide or nitride, and the nitride may be included in an amount of 55 to 95 wt % of the inorganic filler, and more preferably, 60 to 80 wt %. When the nitride is included in this numerical range, thermal conductivity and bonding strength may be enhanced. Here, the nitride may include at least one of boron nitride and aluminum nitride. Here, the boron nitride may be a boron nitride agglomerate in which plate-shaped boron nitride is agglomerated, and a surface of the boron nitride agglomerate may be coated with a polymer having the following Unit 1, or at least a part of the voids in the boron nitride aggregate may be filled by the polymer having the following Unit 1.

Unit 1 is as follows.

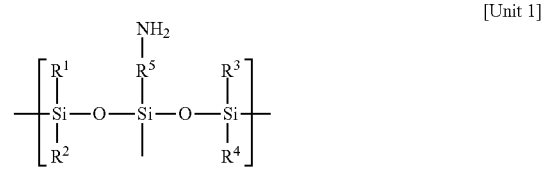

[Unit 1]

Here, one of $R^1$, $R^2$, $R^3$ and $R^4$ may be H, and the others may be selected from the group consisting of a $C_1$-$C_3$ alkyl, a $C_2$-$C_3$ alkene, and a $C_2$-$C_3$ alkyne, and $R^5$ may be a linear, branched, or cyclic divalent organic linker having 1 to 12 carbon atoms.

In one embodiment, one of the remainder among R1, R2, R3, and R4 except for H may be selected from a C2-C3 alkene, and the other one and another one of the remainder may be selected from a C1-C3 alkyl. For example, the polymer according to the embodiment of the present invention may include the following Unit 2.

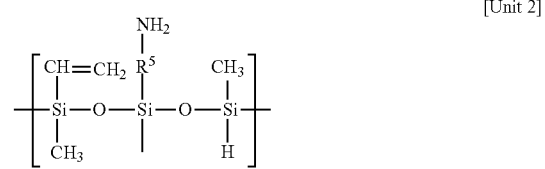

[Unit 2]

Alternatively, the remainder among R1, R2, R3, and R4 except for H may be selected from the group consisting of a C1-C3 alkyl, a C2-C3 alkene and a C2-C3 alkyne to be different from each other.

As described above, when the polymer according to Unit 1 or Unit 2 is coated on the boron nitride agglomerate in which the plate-shaped boron nitride is agglomerated and fills at least a part of the voids in the boron nitride agglomerate, an air layer in the boron nitride agglomerate is minimized and thus the thermal conductivity of the boron nitride agglomerate may be enhanced, and it is possible to prevent breakage of the boron nitride aggregate by increasing a bonding force between the plate-shaped boron nitride. Further, when a coating layer is formed on the boron nitride agglomerate in which the plate-shaped boron nitride is agglomerated, formation of a functional group may be facilitated, and when the functional group is formed on the coating layer of the boron nitride agglomerate, affinity with the resin may be enhanced.

In this case, a particle size D50 of the boron nitride agglomerate may be 250 to 350 μm, and a particle size D50 of the aluminum oxide may be 10 to 30 μm. When the particle size D50 of the boron nitride agglomerate and the particle size D50 of the aluminum oxide satisfy these numerical ranges, the boron nitride agglomerate and the aluminum oxide may be uniformly dispersed in the epoxy resin composition, and accordingly, it is possible to have a uniform heat conduction effect and adhesion performance throughout the resin layer.

Meanwhile, according to the embodiment of the present invention, the bonding strength between the first resin layer 110 and the plurality of first electrodes 120 may be different from the bonding strength between the second resin layer 160 and the plurality of second electrodes 150. For example, when the first metal substrate 170 and the first resin layer 110 are a low-temperature part, and the second metal substrate 180 and the second resin layer 160 are a high-temperature part, the first resin layer 110 and the plurality of first electrodes 120 may be in a state of being adhered to each other, the second resin layer 160 and the plurality of second electrodes 150 may be in a state of being adhered to each other, and an air layer may be formed between the second resin layer 160 and the plurality of second electrodes 150.

As described above, in the case in which the second resin layer 160 and the plurality of second electrodes 150 are not adhered to each other, even when the second metal substrate 170 expands due to an increase in temperature of the high-temperature part side, thermal stress may not be transferred between the plurality of second electrodes 150 and the plurality of P-type thermoelectric legs 130 and between the plurality of second electrodes 150 and the plurality of N-type thermoelectric legs 140. Accordingly, a problem in that cracks are generated in a bonding surface between the plurality of second electrodes 150 and the plurality of P-type thermoelectric legs 130 and a bonding surface between the plurality of second electrodes 150 and the plurality of N-type thermoelectric legs 140 may be prevented, and the reliability of the thermoelectric element at high temperatures may be maintained.

More specifically, the bonding strength between the first resin layer 110 and the plurality of first electrodes 120 may be higher than the bonding strength between the second resin layer 160 and the plurality of second electrodes 150. For example, the bonding strength between the first resin layer 110 and the plurality of first electrodes 120 is 5 times or more the bonding strength between the second resin layer 160 and the plurality of second electrodes 150, preferably, may be 10 times or more, more preferably, 20 times or more, and still more preferably 40 times or more. That is, when the bonding strength between the first resin layer 110 and the plurality of first electrodes 120 is 20 kgf/7.8625 mm2 or more, the bonding strength between the second resin layer 160 and the plurality of second electrodes 150 may be 3 kgf/7.8625 mm2 or less, preferably, may be 2 kgf/7.8625 mm2 or less, more preferably, may be 1 kgf/7.8625 mm2 or less, and still more preferably, may be 0.5 kgf/7.8625 mm2 or less. In the case in which the bonding strength between the first resin layer 110 and the plurality of first electrodes 120 and the bonding strength between the second resin layer 160 and the plurality of second electrodes 150 satisfy these values, even when the second metal substrate 170 expands due to an increase in the temperature of the high-temperature part side, the bonding surface between the plurality of second electrodes 150 and the plurality of P-type thermoelectric legs 130 and the bonding surface between the plurality of second electrodes 150 and the plurality of N-type thermoelectric legs 140 may not be affected.

To this end, referring to FIG. 2, a first sub-module including the first metal substrate 170, the first resin layer 110, the plurality of first electrodes 120, the plurality of P-type thermoelectric legs 130, the plurality of N-type thermoelectric legs 140, and the plurality of second electrodes 150 and a second sub-module including the second resin layer 160 and the second metal substrate 180 may be separately manufactured, and as shown in FIG. 3, after arranging the second sub-module on the first sub-module, a predetermined pressure, for example, a pressure of 70 to 90 kgf/160 cm2 may be applied onto the second sub-module. Accordingly, the plurality of second electrodes 150 of the first sub-module and the second resin layer 160 of the second sub-module are not adhered, but come into physical contact with each other, and may operate as a thermoelectric element when power is applied.

In this case, although not shown, the first metal substrate 170 and the second metal substrate 180 may be fixed to each other. For example, the first metal substrate 170 and the second metal substrate 180 may be fixed to each other by screws. Accordingly, even when the plurality of second electrodes 150 of the first sub-module and the second resin layer 160 of the second sub-module are not adhered to each other, the first sub-module and the second sub-module may not be separated when shaking occurs. Although not shown, the screws which fix the first metal substrate 170 and the second metal substrate 180 may be arranged at corners or edges of the first metal substrate 170 and the second metal substrate 180.

According to the embodiment of the present invention, in the low-temperature part side, the plurality of first electrodes 120 may be formed by etching a metal layer after bonding the metal layer onto the first resin layer 110 applied onto the first metal substrate 170 in an uncured or semi-cured state. Accordingly, the first resin layer 110 and the plurality of first electrodes 120 may be adhered. On the other hand, in the high-temperature part side, the second resin layer 160 may be physically contacted on the plurality of second electrodes 150 after curing the second resin layer 160 applied onto the second metal substrate 180 in an uncured or semi-cured state in advance. To this end, the plurality of pre-aligned second electrodes 150 may be arranged on the plurality of P-type thermoelectric legs 130 and the plurality of N-type thermoelectric legs 140 using a jig, and the plurality of P-type thermoelectric legs 130 and the plurality of N-type thermoelectric legs 140 may be soldered.

That is, the plurality of first electrodes 120 may be formed by etching the metal layer bonded onto the first resin layer 110, but the plurality of second electrodes 150 may be cut in advance and then aligned using a jig. Accordingly, the plurality of first electrodes 120 and the plurality of second electrodes 150 may have different shapes FIG. 4 illustrates a cross section of an electrode of the thermoelectric element according to one embodiment of the present invention, and FIG. 5 illustrates a cross section of an electrode of a thermoelectric element according to another embodiment of the present invention.

Referring to FIGS. 4A and 5A, at least one of the plurality of first electrodes 120 includes a first surface 121 arranged toward the first resin layer 110, that is, the first surface 121 facing the first resin layer 110, and a surface opposite the first surface 121, that is, a second surface 122 arranged toward one pair of the P-type thermoelectric leg 130 and the N-type thermoelectric leg 140, that is, the second surface 122 facing one pair of the P-type thermoelectric leg 130 and the N-type thermoelectric leg 140, and a width W1 of the first surface 121 and a width W2 of the second surface 122 may be different. For example, the width W2 of the second surface 122 may be 0.8 to 0.95 times the width W1 of the first surface 121. Like the above, when the width W1 of the first surface 121 is greater than the width W2 of the second surface 122, since a contact area with the first resin layer 110 increases, the bonding strength between the first resin layer 110 and the first electrode 120 may be enhanced.

Specifically, referring to FIG. 5A, a side surface 123 between the first surface 121 and the second surface 122 may include a curved surface having a predetermined curvature. For example, a surface between the second surface 122 and the side surface 123 may have a round shape having a predetermined curvature. Accordingly, filling a space between the plurality of first electrodes 120 with an insulating resin is facilitated, and thus, the plurality of first electrodes 120 may be stably supported on the first resin layer 110, and the plurality of first electrodes 120 may not electrically affect neighboring electrodes even when placed at a close distance.

In this case, the first electrode 120 may be formed of a Cu layer, may have a structure in which Cu, Ni, and Au are sequentially stacked, or may have a structure in which Cu, Ni, and Sn are sequentially stacked.

On the other hand, referring to FIGS. 4B and 5B, since the plurality of second electrodes 150 are not etched on the resin layer, but are aligned after being cut in advance, a width of a first surface 151 arranged toward the second resin layer 160, that is, the first surface 151 facing the second resin layer 160 may be the same as a width of a surface opposite the first surface 151, that is, a second surface 152 arranged toward one pair of the P-type thermoelectric leg 130 and the N-type thermoelectric leg 140, that is, the second surface 152 facing one pair of the P-type thermoelectric leg 130 and the N-type thermoelectric leg 140. Here, as described above, the first surfaces 151 of the plurality of second electrodes 150 and the second resin layer 160 only come into contact with each other, and may not be adhered to each other. That is, fine air layers may be formed between the first surfaces 151 of the plurality of second electrodes 150 and the second resin layer 160.

Meanwhile, according to still another embodiment of the present invention, the low-temperature part side may be formed by a method of arranging the plurality of first electrodes 120 pre-aligned on a jig on the first resin layer 110 applied on the first metal substrate 170 in an uncured or semi-cured state, and then pressing the plurality of first electrodes 120. Accordingly, the first resin layer 110 and the plurality of first electrodes 120 may be adhered while portions of side surfaces of the plurality of first electrodes 120 are buried in the first resin layer 110. On the other hand, on the high-temperature part side, the second resin layer 160 applied onto the second metal substrate 180 may be cured in advance and then brought in physical contact with the plurality of second electrodes 150. To this end, the plurality of second electrodes 150 may be pre-aligned on the plurality of P-type thermoelectric legs 130 and the plurality of N-type thermoelectric legs 140 using a jig.

FIGS. 6 and 7 are cross-sectional views of a thermoelectric element according to still another embodiment of the present invention.

Referring to FIGS. 6 and 7, portions of the side surfaces 123 of the plurality of first electrodes 120 are buried in the first resin layer 110. In this case, heights H1 of the side surfaces 123 of the plurality of first electrodes 120 buried in the first resin layer 110 are 0.1 to 0.8 times, and preferably, 0.2 to 0.6 times a thickness H of each of the plurality of first electrodes 120. Like the above, when the portions of the side surfaces 121 of the plurality of first electrodes 120 are buried in the first resin layer 110, a contact area between the plurality of first electrodes 120 and the first resin layer 110 increases, and accordingly, the heat transfer performance and bonding strength between the plurality of first electrodes 120 and the first resin layer 110 may further increase. When the heights H1 of the side surfaces 123 of the plurality of first electrodes 120 buried in the first resin layer 110 are smaller than 0.1 times the thickness H of each of the plurality of first electrodes 120, it may difficult to sufficiently obtain the heat transfer performance and bonding strength between the plurality of first electrodes 120 and the first resin layer 110, and when the heights H1 of the side surfaces 123 of the plurality of first electrodes 120 buried in the first resin layer 110 are larger than 0.8 times the thickness H of each of the plurality of first electrodes 120, the first resin layer 110 may rise on the plurality of first electrodes 120, and accordingly, an electrical short circuit may occur.

In this case, a thickness T1 of the first resin layer 110 under each of the plurality of first electrodes 120 may be 20 to 80 μm, and a thickness T2 of the first resin layer 110 between the plurality of first electrodes 120 may be 80 to 200 μm. Like the above, when the thickness T1 of the first resin layer 110 under each of the plurality of first electrodes 120 and the thickness T2 of the first resin layer 110 between the plurality of first electrodes 120 are different, a distribution of the inorganic filler in the first resin layer 110 under each of the plurality of first electrodes 120 may be different from a distribution of the inorganic filler in the first resin layer 110 between the plurality of first electrodes 120. For example, in the case in which the first resin layer 110 includes boron nitride having a D50 of 40 to 200 μm and aluminum oxide having a D50 of 10 to 30 μm, even when the boron nitride and the aluminum oxide are uniformly dispersed in the first resin layer 110 on the whole, the distribution may be partially different. For example, the density of the boron nitride having a D50 of 40 to 200 μm is approximately 2.1 g/cm3, and the density of the aluminum oxide having a D50 of 10 to 30 μm is approximately 3.95 to 4.1 g/cm3. Accordingly, aluminum oxide having a high density and a small size tends to sink down in comparison with boron nitride having a relatively low density and a large size. Specifically, in the region arranged under the plurality of first electrodes 120 in the first resin layer 110, that is, in the region having the thickness T1, the inorganic filler having a large particle size compared to T1 may be pushed to the region between the plurality of first electrodes 120, that is, the region having the thickness T2. Accordingly, the distribution of the inorganic fillers in the first resin layer 110 under the plurality of first electrodes 120 may be different from the distribution of the inorganic fillers in the first resin layer 110 between the plurality of first electrodes 120. For example, a content ratio (for example, a weight ratio) of the boron nitride to the total inorganic filler in the first resin layer 110 under the plurality of first electrodes 120 may be smaller than a content ratio (for example, a weight ratio) of the boron nitride to the total inorganic filler in the first resin layer 110 between the plurality of first electrodes 120. Accordingly, the particle size D50 of the inorganic filler in the first resin layer 110 under the plurality of first electrodes 120 may be smaller than the particle size D50 of the inorganic filler in the first resin layer 110 between the plurality of first electrodes 120. The aluminum oxide may not affect the adhesion performance between the first resin layer 110 and the plurality of first electrodes 120, but the boron nitride has a smooth surface, and thus may adversely affect the adhesion performance between the first resin layer 110 and the plurality of first electrodes 120. Like the embodiment of the present invention, when the plurality of first electrodes 120 are buried in the first resin layer 110, the content of the boron nitride in the first resin layer 110 arranged under the plurality of first electrodes 120 is reduced, and accordingly, the bonding strength between the plurality of first electrodes 120 and the first resin layer 110 may increase in comparison with a case in which the plurality of first electrodes 120 are not buried in the first resin layer 110.

Here, it is shown that only the plurality of first electrodes 120 are buried in the first resin layer 110 and the plurality of second electrodes 150 are not buried in the second resin layer 160, but the present invention is not limited thereto. According to the embodiment of the present invention, as described above, the first sub module including the first metal substrate 170, the first resin layer 110, the plurality of first electrodes 120, the plurality of P-type thermoelectric legs 130, the plurality of N-type thermoelectric legs 140, and the plurality of second electrodes 150 and the second sub module including the second resin layer 160 and the second metal substrate 180 may be separately manufactured, and after arranging the second sub module on the first sub module, a predetermined pressure, for example, a pressure of 70 to 90 kgf/160 cm2 may be applied on the second sub module. That is, in a process of manufacturing the thermoelectric device according to the embodiment of the present invention, after the second resin layer 160 is arranged on the plurality of second electrodes 150, since a predetermined pressure, for example, a pressure of 70 to 90 kgf/160 cm2 is applied, portions of side surfaces of the plurality of second electrodes 150 may also be buried in the second resin layer 160. However, a height of each of the side surfaces of the plurality of second electrodes 150 buried in the second resin layer 160 may be smaller than a height H1 of each of the side surfaces 124 of the plurality of first electrodes 120 buried in the first resin layer 110. For example, the height of each of the side surfaces of the plurality of second electrodes 150 buried in the second resin layer 160 may be 01 to 0.5 times, preferably, 0.05 to 0.3 times, and more preferably, 0.1 to 0.2 times the height H1 of each of the side surfaces 124 of the plurality of first electrodes 120 buried in the first resin layer 110. Accordingly, the high-temperature part side may have high heat transfer performance, and may also maintain stable reliability even at high temperatures.

Meanwhile, referring to FIG. 7, a plurality of grooves which accommodate portions of bottom surfaces and the side surfaces of the plurality of second electrodes 150 may be formed in advance in the second resin layer 160. Here, the bottom surfaces of the plurality of second electrodes 150 may refer to surfaces arranged to face the second resin layer 160 among both surfaces of the plurality of second electrodes 150, that is, surfaces which come into contact with the second resin layer 160. In this case, a width W3 of each of the plurality of grooves may be larger than a width W1 of the bottom surface of each of the plurality of second electrodes 150. For example, the width W3 of each of the plurality of grooves may be 1.01 to 1.2 times, and preferably, 1.01 to 1.1 times the width W1 of the bottom surface of each of the plurality of second electrodes 150. Like the above, when the plurality of second electrodes 150 are accommodated in the plurality of grooves formed in the second resin layer 160, since the second resin layer 160 may support the side surfaces of the plurality of second electrodes 150 even when the plurality of second electrodes 150 and the second resin layer 160 are not adhered to each other, it is possible to prevent a problem in which the plurality of second electrodes 150 slide on the second resin layer 160 when shaking, and the possibility in which the first sub module and the second sub module are separated from each other may be lowered. Further, when the width W3 of each of the plurality of grooves is formed to be larger than the width W1 of the bottom surface of each of the plurality of second electrodes 150, thermal stress applied to the plurality of second electrodes 150 may be minimized even when the second metal substrate 180 is thermally expanded due to high temperature.

Referring to FIG. 1 again, when the first resin layer 110 is arranged between the first metal substrate 170 and the plurality of first electrodes 120, heat may be transferred between the first metal substrate 170 and the plurality of first electrodes 120 without a separate ceramic substrate, and a separate adhesive or physical fastening means is not required due to the adhesive performance of the first resin layer 110 itself. Accordingly, an overall size of the thermoelectric element 100 may be reduced.

Here, the first metal substrate 170 may be in direct contact with the first resin layer 110. To this end, surface roughness may be formed on the surface on which the first resin layer 110 is arranged among both surfaces of the first metal substrate 170, that is, the surface of the first metal substrate 170 facing the first resin layer 110. Accordingly, a problem in that the first resin layer 110 is lifted when the first metal substrate 170 and the first resin layer 110 are thermally compressed may be prevented. In this specification, the surface roughness refers to unevenness and may be interchanged with surface coarseness.

FIG. 8 is a top view of a first metal substrate of the thermoelectric element according to one embodiment of the present invention, FIG. 9 is a cross-sectional view of the first metal substrate of the thermoelectric element according to the embodiment in FIG. 8, FIG. 10 is an enlarged cross-sectional view of the first metal substrate of the thermoelectric element according to the embodiment in FIG. 8, FIG. 11 is a top view of a first metal substrate of the thermoelectric element according to another embodiment of the present invention, and FIG. 12 is a cross-sectional view of the first metal substrate of the thermoelectric element according to the embodiment in FIG. 11. For convenience of description, only the first metal substrate 170 and the first resin layer 110 are described as examples, but the present invention is not limited thereto, and this structure may be equally applied between the second metal substrate 180 and the second resin layer 160.

Referring to FIGS. 8 to 10, the surface on which the first resin layer 110 is arranged among both surfaces of the first metal substrate 170, that is, the surface of the first metal substrate 170 facing the first resin layer 110, may include a first region 172 and a second region 174, and the second region 174 may be arranged in the first region 172. That is, the first region 172 may be arranged within a predetermined distance from an edge of the first metal substrate 170 toward a center region, and the first region 172 may surround the second region 174.

In this case, a surface roughness of the second region 174 may be larger than a surface roughness of the first region 172, and the first resin layer 110 may be arranged on the second region 174. Here, the first resin layer 110 may be arranged to be spaced apart by a predetermined distance from a boundary between the first region 172 and the second region 174. That is, the first resin layer 110 may be arranged on the second region 174, but the edge of the first resin layer 110 may be located in the second region 174. Accordingly, in at least some of grooves 400 formed by the surface roughness of the second region 174, a part of the first resin layer 110, that is, an epoxy resin 600 and a part 604 of the inorganic filler included in the first resin layer 110 may permeate, and adhesion between the first resin layer 110 and the first metal substrate 170 may increase.

However, the surface roughness of the second region 174 may be larger than the particle size D50 of a part of the inorganic filler included in the first resin layer 110 and smaller than the particle size D50 of the other part of the inorganic filler. Here, the particle size D50 may refer to a particle diameter corresponding to 50% of a weight percentage in a particle size distribution curve, that is, a particle diameter at which a passing mass percentage becomes 50%, and may be interchanged with an average particle diameter. In an example in which the first resin layer 110 includes aluminum oxide and boron nitride as inorganic fillers, the aluminum oxide does not affect the adhesion performance between the first resin layer 110 and the first metal substrate 170, but since the boron nitride has a smooth surface, the adhesion performance between the first resin layer 110 and the first metal substrate 170 may be adversely affected. Accordingly, when the surface roughness of the second region 174 is formed to be larger than the particle size D50 of the aluminum oxide included in the first resin layer 110, but smaller than the particle size D50 of the boron nitride, since only the aluminum oxide is arranged in the grooves formed by the surface roughness of the second region 174, and the boron nitride may not be arranged in the grooves, the first resin layer 110 and the first metal substrate 170 may maintain high bonding strength.

Accordingly, the surface roughness of the second region 174 may be 1.05 to 1.5 times the particle size D50 of an inorganic filler 604 having a relatively small size among the inorganic fillers included in the first resin layer 110, for example, the aluminum oxide, and may be 0.04 to 0.15 times the particle size D50 of an inorganic filler 602 having a relatively large size among the inorganic fillers included in the first resin layer 110, for example, the boron nitride.

As described above, when the particle size D50 of the boron nitride agglomerate is 250 to 350 µm and the particle size D50 of the aluminum oxide is 10 to 30 µm, the surface roughness of the second region 174 may be 1 to 50 µm. Accordingly, only the aluminum oxide is arranged in the groove formed by the surface roughness of the second region 174, and the boron nitride agglomerate may not be arranged.

Accordingly, the content of each of the epoxy resin and the inorganic filler in the groove formed by the surface roughness of the second region 174 may be different from the content of each of the epoxy resin and the inorganic filler in a middle region between the first metal substrate 170 and the plurality of first electrodes 120.

The surface roughness may be measured using a surface roughness meter. The surface roughness meter measures a cross-sectional curve using a probe, and may calculate the surface roughness using a peak line, a valley bottom line, an average line, and a reference length of the cross-sectional curve. In this specification, the surface roughness may refer to arithmetic average roughness (Ra) by a center line average calculation method. The arithmetic average roughness (Ra) may be obtained through the following Equation 2.

$$R_a = \frac{1}{L}\int_0^L |f(x)|dx \quad \text{[Equation 2]}$$

That is, when the cross-sectional curve obtained by the probe of the surface roughness meter is extracted as much as a reference length L and expressed as a function (f(x)) with an average line direction set to an x-axis and a height direction set to a y-axis, the value obtained by Equation 2 may be expressed in micrometers.

Referring to FIGS. 11 and 12, a surface on which a first resin layer 110 is arranged among both surfaces of a first metal substrate 170, that is, a surface of the first metal substrate 170 facing the first resin layer 110 may include a first region 172 and a second region 174 surrounded by the first region 172 and having a larger surface roughness than the first region 172, and may further include a third region 176.

Here, the third region 176 may be arranged in the second region 174. That is, the third region 176 may be arranged to be surrounded by the second region 174. Further, the surface roughness of the second region 174 may be formed larger than the surface roughness of the third region 176.

In this case, the first resin layer 110 is arranged to be spaced apart from a boundary between the first region 172 and the second region 174 by a predetermined distance, and may be arranged to cover a part of the second region 174 and the third region 176.

In order to enhance the bonding strength between the first metal substrate 170 and the first resin layer 110, an adhesive layer 800 may be further arranged between the first metal substrate 170 and the first resin layer 110.

The adhesive layer 800 may be an epoxy resin composition the same as the epoxy resin composition constituting the first resin layer 110. For example, the first metal substrate 170 and the first resin layer 110 may be adhered to each other using a method of applying the epoxy resin composition the same as the epoxy resin composition constituting the first resin layer 110 to a space between the first metal substrate 170 and the first resin layer 110 in an uncured state, and then stacking the cured first resin layer 110 and pressurizing the first resin layer 110 at a high temperature.

In this case, a part of the adhesive layer 800, for example, some of the epoxy resin and some of the inorganic filler of the epoxy resin composition constituting the adhesive layer 800 may be arranged in at least a part of the groove according to the surface roughness of the second region 174.

FIG. 13 is a graph comparing a rate of a change in resistance and a rate of a change in power generation of thermoelectric devices according to Comparative Example and Example.

Both the thermoelectric device according to Comparative Example and the thermoelectric device according to Example, as in the structure of FIG. 1, include a first metal substrate, a first resin layer, a plurality of first electrodes, a plurality of P-type thermoelectric legs, a plurality of N-type thermoelectric legs, a plurality of second electrodes, a second resin layer, and a second metal substrate, wherein the thermoelectric device according to Comparative Example was manufactured so that the first resin layer and the plurality of first electrodes are adhered to each other, and the second resin layer and the plurality of second electrodes are adhered to each other, and the thermoelectric device according to Example was manufactured so that the first resin layer and the plurality of first electrodes are adhered to each other, and the second resin layer and the plurality of second electrodes are not adhered to each other but come into contact with each other. In this case, the bonding strength between the first resin layer and the plurality of first electrodes and the bonding strength between the second resin layer and the plurality of second electrodes were measured using ST-1000 of Salt Co. Ltd., and to this end, the electrode was manufactured with an area of 7.8625 mm2 (=4.25 mm*1.85 mm). As a result, in the case of the thermoelectric device according to Comparative Example, the bonding strength between the first resin layer and the plurality of first electrodes and the bonding strength between the second resin layer and the plurality of second electrodes were both measured to be 20 kgf/7.8625 mm2, and in the case of the thermoelectric device according to Example, the bonding strength between the first resin layer and the plurality of first electrodes was measured to be 20 kgf/7.8625 mm2, and the bonding strength between the second resin layer and the plurality of second electrodes was measured to be 3 kgf/7.8625 mm2.

In both the thermoelectric device according to Comparative Example and the thermoelectric device according to Example, a rate of a change in resistance and a rate of a change in power generation were measured by setting a period in which a temperature at the low-temperature part side was maintained at 30° C., and a temperature at the high-temperature part side was changed from 200° C. to 50° C. as one cycle, and repeating the cycle.

Referring to FIG. 13, in the case of the thermoelectric device according to Comparative Example, it can be seen that the resistance change rate exceeded 8% around 100 cycles, but in the case of the thermoelectric device according to Example, it can be seen that the resistance change rate did not significantly change even at 1000 cycles. Further, in the case of the thermoelectric device according to Comparative Example, the power generation amount was 23% around 100 cycles, but in the case of the thermoelectric device according to Example, it can be seen that the power generation amount increased even when the cycle increases.

Hereinafter, with reference to FIG. 14, an example in which the thermoelectric element according to the embodiment of the present invention is applied to a water purifier will be described.

FIG. 14 is a block diagram of a water purifier to which the thermoelectric element according to the embodiment of the present invention is applied.

A water purifier 1 to which the thermoelectric element according to the embodiment of the present invention is applied includes a raw water supply pipe 12a, a purified water tank inlet pipe 12b, a purified water tank 12, a filter assembly 13, a cooling fan 14, and a heat storage tank 15, a cold water supply pipe 15a, and a thermoelectric device 1000.

The raw water supply pipe 12a is a supply pipe which introduces water to be purified into the filter assembly 13 from a water source, the purified water tank inlet pipe 12b is an inlet pipe which introduces the purified water from the filter assembly 13 into the purified water tank 12, and the cold water supply pipe 15a is a supply pipe through which cold water cooled to a predetermined temperature by the thermoelectric device 1000 in the purified water tank 12 is finally supplied to a user.

The purified water tank 12 temporarily accommodates the purified water to store the water purified through the filter assembly 13 and introduced through the purified water tank inlet pipe 12b and supply the water to the outside.

The filter assembly 13 is composed of a precipitation filter 13a, a pre-carbon filter 13b, a membrane filter 13c, and a post-carbon filter 13d.

That is, the water introduced into the raw water supply pipe 12a may be purified through the filter assembly 13.

The heat storage tank 15 is arranged between the purified water tank 12 and the thermoelectric device 1000 to store cold air generated in the thermoelectric device 1000. The cold air stored in the heat storage tank 15 is applied to the purified water tank 12 to cool the water accommodated in the purified water tank 120.

The heat storage tank 15 may come into surface contact with the purified water tank 12 so that the cold air may be smoothly transferred.

As described above, the thermoelectric device 1000 includes a heat absorbing surface and a heating surface, and has one side which is cooled and the other side which is heated by the movement of electrons on a P-type semiconductor and an N-type semiconductor.

Here, the one side may be a side of the purified water tank 12 and the other side may be a side opposite the purified water tank 12.

Further, as described above, the thermoelectric device 1000 has excellent waterproofing and dustproofing performance, and improved heat flow performance, and thus may efficiently cool the purified water tank 12 in the water purifier.

Hereinafter, with reference to FIG. 15, an example in which the thermoelectric element according to the embodiment of the present invention is applied to a refrigerator will be described.

Figure 15:
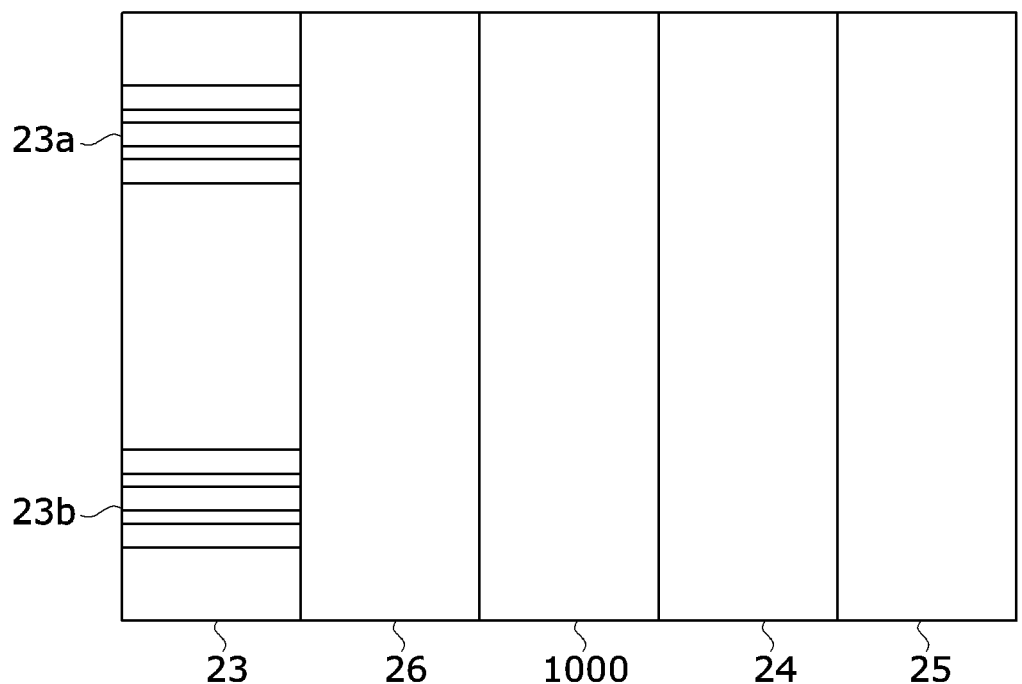
FIG. 15 is a block diagram of a refrigerator to which the thermoelectric element according to the embodiment of the present invention is applied.

FIG. 15 is a block diagram of a refrigerator to which the thermoelectric element according to the embodiment of the present invention is applied.

The refrigerator includes a deep temperature evaporation chamber cover 23, an evaporation chamber partition wall 24, a main evaporator 25, a cooling fan 26, and a thermoelectric device 1000 in a deep temperature evaporation chamber.

The inside of the refrigerator is partitioned into a deep temperature storage chamber and the deep temperature evaporation chamber by the deep temperature evaporation chamber cover 23.

Specifically, an inner space corresponding to a front of the deep temperature evaporation chamber cover 23 may be defined as the deep temperature storage chamber, and an inner space corresponding to a rear of the deep temperature evaporation chamber cover 23 may be defined as the deep temperature evaporation chamber.

A discharge grill 23a and a suction grill 23b may be formed on a front surface of the deep temperature evaporation chamber cover 23.

The evaporation chamber partition wall 24 is installed at a point spaced frontward from a rear wall of an inner cabinet, and partitions a space where the deep temperature storage chamber is located and a space where the main evaporator 25 is located.

The cold air cooled by the main evaporator 25 is supplied to a freezing chamber and then returns to the main evaporator.

The thermoelectric device 1000 is accommodated in the deep temperature evaporation chamber, and has a structure in which the heat absorbing surface faces a drawer assembly of the deep temperature storage chamber, and the heating surface faces the evaporator. Accordingly, a heat absorbing phenomenon generated by the thermoelectric device 1000 may be used to quickly cool food stored in the drawer assembly to a cryogenic state of minus 50° C. or lower.

Further, as described above, the thermoelectric device 1000 has excellent waterproofing and dustproofing performance, and improved heat flow performance, and thus may efficiently cool the drawer assembly in the refrigerator.

The thermoelectric element according to the embodiment of the present invention may be applied to a device for power generation, a device for cooling, a device for heating, and the like. Specifically, the thermoelectric element according to the embodiment of the present invention may be mainly applied to an optical communication module, a sensor, a medical device, a measuring device, the aerospace industry, a refrigerator, a chiller, an automobile ventilation sheet, a cup holder, a washing machine, a dryer, a wine cellar, a water purifier, a power supply device for a sensor, a thermopile, and the like.

Here, as an example in which the thermoelectric element according to the embodiment of the present invention is applied to a medical device, there is a polymerase chain reaction (PCR) device. The PCR device is a device for amplifying deoxyribonucleic acid (DNA) to determine a nucleotide sequence of DNA, and demands precise temperature control and requires a thermal cycle. To this end, a Peltier-based thermoelectric element may be applied.

As another example in which the thermoelectric element according to the embodiment of the present invention is applied to a medical device, there is a photodetector. Here, the photodetector includes an infrared/ultraviolet detector, a charge coupled device (CCD) sensor, an X-ray detector, a thermoelectric thermal reference source (TTRS), and the like. The Peltier-based thermoelectric element may be applied for cooling the photodetector. Accordingly, it is possible to prevent a wavelength change, an output decrease, a resolution decrease, and the like due to a temperature increase in the photodetector.

As still another example in which the thermoelectric element according to the embodiment of the present invention is applied to a medical device, there is the immunoassay field, the in vitro diagnostics field, a general temperature control and cooling system, the physical therapy field, a liquid chiller system, the blood/plasma temperature control field, or the like. Accordingly, precise temperature control is possible.

As yet another example in which the thermoelectric element according to the embodiment of the present invention is applied to a medical device, there is an artificial heart. Accordingly, power may be supplied to the artificial heart.

As an example in which the thermoelectric element according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain a temperature of an image sensor.

As another example in which the thermoelectric element according to the embodiment of the present invention is applied to the aerospace industry, there is a cooling device, a heater, a power generation device, or the like.

In addition, the thermoelectric element according to the embodiment of the present invention may be applied to other industrial fields for power generation, cooling, and heating.

Although the above-described embodiments are mainly described with reference to the embodiments of the present invention, the above is only exemplary, and it should be understood that those skilled in the art may variously perform modifications and applications within the spirit of the embodiments. For example, elements specifically shown in the embodiments may be modified. Further, differences related to modifications and changes should be understood as being included in the scope of the present invention defined in the appended claims.

The invention claimed is:

1. A thermoelectric element comprising:
a first metal substrate;
a first resin layer which is arranged on the first metal substrate, and comes into direct contact with the first metal substrate;
a plurality of first electrodes arranged on the first resin layer;
a plurality of P-type thermoelectric legs and a plurality of N-type thermoelectric legs which are arranged on the plurality of first electrodes;
a plurality of second electrodes arranged on the plurality of P-type thermoelectric legs and the plurality of N-type thermoelectric legs;
a second resin layer arranged on the plurality of second electrodes; and
a second metal substrate which is arranged on the second resin layer, and comes into direct contact with the second resin layer,
wherein the first resin layer and the plurality of first electrodes adhere to each other; and
wherein the second resin layer and the plurality of second electrodes come into contact with each other, wherein:
the second resin layer includes a plurality of grooves; and
a top surface of each of the plurality of second electrodes which comes into contact with the second resin layer and parts of side surfaces of the plurality of second electrodes are accommodated in the plurality of grooves,
wherein the plurality of second electrodes includes a first one of the second electrodes having the top surface that faces the second resin layer, a first side surface, a second side surface and a bottom surface that faces the first resin layer,
wherein the bottom surface of the first one of the second electrodes is disposed in a first direction over one of the P-type thermoelectric legs and one of the N-type thermoelectric legs,
wherein the plurality of grooves includes a first one of the grooves having a top groove surface and at least a wall groove surface that extends in the first direction away from the top groove surface,
wherein the top surface of the first one of the second electrodes is to contact the top groove surface of the first one of the grooves, and
wherein an entire area of the first side surface of the first one of the second electrodes is to be spaced apart from the wall groove surface of the first one of the grooves.

2. The thermoelectric element of claim 1, wherein the first metal substrate and the second metal substrate are fixed to each other.

3. The thermoelectric element of claim 2, wherein the first metal substrate and the second metal substrate are fixed to each other by a screw.

4. The thermoelectric element of claim 1, wherein a width of each of the plurality of grooves is greater than a width of the top surface of each of the plurality of second electrodes.

5. The thermoelectric element of claim 4, wherein the width of each of the plurality of grooves is 1.01 to 1.2 times the width of the top surface of each of the plurality of second electrodes.

6. The thermoelectric element of claim 1, wherein:
parts of side surfaces of the plurality of first electrodes are buried in the first resin layer;
parts of the first side surface and the second side surface of the first one of the second electrodes are buried in the second resin layer; and
a height of each of the first side surface and the second side surface of the first one of the second electrodes buried in the second resin layer is smaller than a height of each of the side surfaces of the plurality of first electrodes buried in the first resin layer.

7. The thermoelectric element of claim 6, wherein the height of each of the first side surface and the second side surface of the first one of the second electrodes buried in the second resin layer is 0.01 to 0.5 times the height of each of the side surfaces of the plurality of first electrodes buried in the first resin layer.

8. The thermoelectric element of claim 1, wherein a shape of a cross section of at least one of the plurality of first electrodes differs from a shape of a cross section of at least one of the plurality of second electrodes.

9. The thermoelectric element of claim 8, wherein a width of a first surface facing the first resin layer in at least one of the plurality of first electrodes differs from a width of a second surface opposite the first surface.

10. The thermoelectric element of claim 9, wherein the width of the first surface is 0.8 to 0.95 times the width of the second surface.

11. The thermoelectric element of claim 8, wherein a side surface between a first surface facing the first resin layer in at least one of the plurality of first electrodes and a second surface opposite the first surface includes a curved surface having a predetermined curvature.

12. The thermoelectric element of claim 1, wherein a surface roughness is formed on a surface of the first metal substrate on which the first resin layer is arranged.

13. The thermoelectric element of claim 1, further comprising an adhesive layer arranged between the first metal substrate and the first resin layer.

\* \* \* \* \*